United States Patent
Wang et al.

(10) Patent No.: US 10,304,861 B2
(45) Date of Patent: May 28, 2019

(54) ARRAY SUBSTRATE AND METHOD OF MANUFACTURING THE SAME, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Jianfeng Yuan, Beijing (CN); Huibin Guo, Beijing (CN); Yuchun Feng, Beijing (CN); Liangliang Li, Beijing (CN); Tsung-Chieh Kuo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/326,383

(22) PCT Filed: Jan. 29, 2016

(86) PCT No.: PCT/CN2016/072752
§ 371 (c)(1),
(2) Date: Jan. 13, 2017

(87) PCT Pub. No.: WO2017/054384
PCT Pub. Date: Apr. 6, 2017

(65) Prior Publication Data
US 2017/0271370 A1    Sep. 21, 2017

(30) Foreign Application Priority Data
Sep. 28, 2015   (CN) .......................... 2015 1 0629727

(51) Int. Cl.
*H01L 29/04*       (2006.01)
*H01L 27/12*       (2006.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
CPC .. G02F 1/1362–2001/13685; G02F 2201/121; G02F 2201/12; G02F 2201/123;
(Continued)

(56) References Cited

U.S. PATENT DOCUMENTS

2009/0086143 A1   4/2009  Kaneko et al.
2010/0295049 A1   11/2010 Yoo et al.
(Continued)

FOREIGN PATENT DOCUMENTS

CN    101609234 A    12/2009
CN    101894807 A    11/2010
(Continued)

OTHER PUBLICATIONS

International Search Report and Written Opinion (including English translation of Box V.) dated Jul. 1, 2016, for corresponding PCT Application No. PCT/CN2016/072752.
(Continued)

*Primary Examiner* — Kevin M Picardat
(74) *Attorney, Agent, or Firm* — Kinney & Lange, P.A.

(57) ABSTRACT

The present disclosure provide an array substrate and a method of manufacturing the same, and a display panel. The array substrate includes: a base substrate; a first signal transmission layer comprising a common electrode line; a first insulating layer covering the first signal transmission layer and having a first through hole at a position corre-
(Continued)

sponding to the common electrode line; a first electrode layer located on the first insulating layer, the first electrode layer comprising a connection electrode located at the position of the first through hole; a second insulating layer covering the first electrode layer and having a second through hole at a position corresponding to the connection electrode; and a second electrode layer comprising a common electrode that covers the second through hole; the connection electrode contacts the common electrode line and the common electrode respectively.

15 Claims, 5 Drawing Sheets

(51) Int. Cl.
G02F 1/1333 (2006.01)
G02F 1/1343 (2006.01)
G02F 1/1362 (2006.01)
G02F 1/1368 (2006.01)

(52) U.S. Cl.
CPC .. *G02F 1/133345* (2013.01); *G02F 1/134309* (2013.01); *G02F 1/136227* (2013.01); *G02F 1/136286* (2013.01); *H01L 27/1218* (2013.01); *H01L 27/1244* (2013.01); *H01L 27/1248* (2013.01); *H01L 27/1288* (2013.01); *G02F 2001/134372* (2013.01); *G02F 2201/121* (2013.01); *G02F 2201/123* (2013.01)

(58) Field of Classification Search
CPC ............. H01L 27/1251; H01L 27/1248; H01L 27/1288; H01L 27/1214; H01L 27/1218
See application file for complete search history.

(56) References Cited

U.S. PATENT DOCUMENTS

| 2012/0193624 | A1 | 8/2012 | You | |
|---|---|---|---|---|
| 2015/0048514 | A1* | 2/2015 | Tang | H01L 21/768 257/774 |
| 2015/0091015 | A1* | 4/2015 | Park | H01L 27/124 257/72 |
| 2015/0303150 | A1 | 10/2015 | Choi et al. | |
| 2016/0064415 | A1* | 3/2016 | Zhan | H01L 27/124 257/72 |
| 2016/0111442 | A1 | 4/2016 | Wu et al. | |
| 2016/0276376 | A1 | 9/2016 | Sun et al. | |

FOREIGN PATENT DOCUMENTS

| CN | 102623460 A | 8/2012 |
|---|---|---|
| CN | 103208491 A | 7/2013 |
| CN | 103681693 A | 3/2014 |
| CN | 103972245 A | 8/2014 |
| CN | 104022126 A | 9/2014 |
| CN | 104091805 A | 10/2014 |
| CN | 104332473 A | 2/2015 |
| CN | 104576526 A | 4/2015 |
| CN | 104617039 A | 5/2015 |
| CN | 104617104 A | 5/2015 |
| CN | 105161505 A | 12/2015 |

OTHER PUBLICATIONS

First Chinese Office Action, for Chinese Patent Application No. 201510629727.0, dated Aug. 3, 2017, 17 pages.
Second Chinese Office Action, for Chinese Patent Application No. 201510629727.0, dated Mar. 15, 2018, 16 pages.

* cited by examiner

ARRAY SUBSTRATE AND METHOD OF MANUFACTURING THE SAME, AND DISPLAY PANEL

CROSS-REFERENCE TO RELATED APPLICATION

This application claims the benefit of Chinese Patent Application No. 201510629727.0 filed on Sep. 28, 2015 in the State Intellectual Property Office of China, the whole disclosure of which is incorporated herein by reference.

BACKGROUND

Technical Field

Embodiments of the present disclosure generally relate to the field of display technologies, and particularly, to an array substrate and a method of manufacturing the same, and a display panel.

Description of the Related Art

TFT-LCDs become dominant in current market of flat panel display due to their advantages such as small volume, light weight, low power consumption, no radiation and the like. A TFT-LCD display screen generally includes an array substrate, a color filter base substrate and liquid crystal therebetween. The TFT-LCD display screen is provided with hundreds of thousands to millions of display units arranged in an array, and each display unit displays an image under control of TFT. It is desired to further improve yield of the display unit.

Exemplarily, as shown in FIG. 1, there is shown a schematic diagram of a display unit on an array substrate of an existing TFT-LCD display screen, and a plurality of gate lines 121 and data lines 16 are formed on the array substrate, the gate lines 121 and the data lines 16 cross each other to define a display unit. FIG. 2 is a schematic diagram taken along line a-a' shown in FIG. 1. As shown in FIG. 2, the array substrate comprises: a base substrate 11; a gate electrode (a portion of the gate line 121) and a common electrode line 122 formed on base substrate 11; a gate insulating layer 13 covering the gate electrode 121 and the common electrode line 122; an active layer 14, a source electrode 161 and a drain electrode 162 formed on gate insulating layer 13; a passivation layer 15 and a pixel electrode 17 formed on the passivation layer 15; a planarization layer 18 and a common electrode 19 formed on the planarization layer 18. Generally, the common electrode 19 is connected with the common electrode line 122 through a through hole 1 through the planarization layer 18, the passivation layer 15 and the gate insulating layer 13, and the pixel electrode 17 is connected with drain electrode 162 through a through hole 2 in the passivation layer 15.

It has been found by inventors that for the existing array substrate, as shown in FIG. 2, since the through hole 1 penetrates through the planarization layer 18, the passivation layer 15 and the gate insulating layer 13, the through hole 1 has a larger depth, so that a connection between the common electrode 19 and the common electrode line 122 will easily be broken, resulting in a poor display effect and reduction in yield of product.

SUMMARY

Embodiments of the present disclosure provide an array substrate and a method of manufacturing the same, and a display panel, for avoiding a bad connection due to a deeper through hole by connecting a common electrode on the array substrate with a common electrode line through a plurality of conductive layers.

Embodiments of the present disclosure provide following technique solutions:

In an aspect, an embodiment of the present disclosure provides an array substrate, comprising:

a base substrate;

a first signal transmission layer comprising a common electrode line;

a first insulating layer covering the first signal transmission layer and having a first through hole at a position corresponding to the common electrode line;

a first electrode layer located on the first insulating layer, the first electrode layer comprising a connection electrode located at the position of the first through hole;

a second insulating layer covering the first electrode layer and having a second through hole at a position corresponding to the connection electrode; and a second electrode layer comprising a common electrode that covers the second through hole;

the connection electrode is in contact with the common electrode line and the common electrode respectively.

Optionally, the second through hole is located at a position corresponding to the first through hole; or the connection electrode extends out of the first through hole and extends over at least a portion of an upper surface of the first insulating layer; and the second through hole is formed at a position of the second insulating layer corresponding to a portion, which extends out of the first through hole and extends over at least a portion of an upper surface of the first insulating layer, of the connection electrode.

Optionally, the first electrode layer comprises:

a first electrode sub-layer comprising a pixel electrode and a first connection electrode located at the position of the first through hole; and a second electrode sub-layer comprising a second connection electrode located at located at the position of the first through hole, the second electrode sub-layer being disposed on the first electrode sub-layer.

Optionally, a material for forming the first electrode sub-layer comprises a tin indium oxide material and a material for forming the second electrode sub-layer a comprises metal.

Optionally, the second sub-layer comprises two molybdenum metal layers and an aluminum metal layer located between the two molybdenum metal layers.

Optionally, the first signal transmission layer further comprises a gate line and a gate electrode; and the array substrate further comprises:

a gate insulating layer covering the first signal transmission layer and having a first sub-through hole at a position corresponding to the common electrode line;

an active layer located on the gate insulating layer;

a second signal transmission layer comprising a data line, a source electrode and a drain electrode; and a passivation layer having a second sub-through hole at a position corresponding to the first sub-through hole and a third through hole at a position corresponding to the drain electrode, a pixel electrode being connected with the drain electrode at the third sub-through hole;

wherein, the first electrode layer is disposed on the passivation layer, the first insulating layer comprises the gate insulating layer and the passivation layer, the second electrode sub-layer further comprises an auxiliary electrode connected with the pixel electrode at least at a position corresponding to the third through hole.

Optionally, the array substrate comprises a transparent region and a non-transparent region, and the auxiliary electrode is connected with the pixel electrode within the non-transparent region.

Optionally, the second signal transmission layer further comprises a third connection electrode located at the position of the first through hole.

In another aspect, an embodiment of the present disclosure provides a method of manufacturing an array substrate, comprising steps of:

forming a first signal transmission layer on a base substrate, the first signal transmission layer comprising a common electrode line;

forming a first insulating layer on the base substrate, the first insulating layer covering the first signal transmission layer and the first insulating layer having a first through hole at a position corresponding to the common electrode line;

forming a first electrode layer on the base substrate, the first electrode layer being located on the first insulating layer and comprising a connection electrode located at the position of the first through hole;

forming a second insulating layer on the base substrate, the second insulating layer covering the first electrode layer and the second insulating layer having a second through hole at a position corresponding to the connection electrode; and forming a second electrode layer on the base substrate, the second electrode layer comprising a common electrode that covers the second through hole;

wherein the connection electrode is in contact with the common electrode line and the common electrode respectively.

Optionally, the step of the second insulating layer having the second through hole at the position corresponding to the connection electrode further comprises:

the connection electrode layer has the second through hole at a position corresponding to the first through hole; or the connection electrode extends out of the first through hole and extends over at least a portion of an upper surface of the first insulating layer, and the second through hole is formed at a position of the second insulating layer corresponding to a portion, which extends out of the first through hole and extends over at least a portion of an upper surface of the first insulating layer, of the connection electrode.

Optionally, the step of forming the first electrode layer on the base substrate further comprises:

forming a first conductive film, a second conductive film and photoresist on the base substrate to cover the first electrode layer, the first conductive film and the second conductive film covering the first through hole;

performing exposure and development processes to the photoresist by using a half gray-scale mask, which includes a transparent region, a semitransparent region corresponding to a pixel electrode and a non-transparent region corresponding to the first through hole;

fully removing a portion of the developed photoresist corresponding to the transparent region so as to expose the second conductive film, and partially removing a portion of the developed photoresist corresponding to the semitransparent region;

etching portions of the second conductive film and the first conductive film corresponding to the transparent region;

performing an ashing treatment to the photoresist such that a portion of the photoresist corresponding to semitransparent region is fully removed to expose the second conductive film and a portion of the photoresist corresponding to the non-transparent region is remained;

etching a portion of the second conductive film corresponding to the semitransparent region; and peeling off the photoresist.

Optionally, the first conductive film is formed from a tin indium oxide material and the second conductive film is formed from a metal material.

Optionally, the step of forming the first conductive film, the second conductive film and photoresist on the base substrate to cover the first electrode layer further comprises:

forming the first conductive film on the first insulating layer;

forming the second conductive film on the first conductive film, including forming a molybdenum metal film, an aluminum metal film and a molybdenum metal film sequentially; and forming the photoresist over the second conductive film.

Optionally, the first signal transmission layer further comprises a gate line and a gate electrode; and the step of forming the first insulating layer on the base substrate to cover the first signal transmission layer further comprises:

forming a gate insulating layer on the base substrate, the gate insulating layer covering the first signal transmission layer and the gate insulating layer having a first sub-through hole at a position corresponding to the common electrode line;

forming an active layer on the base substrate;

forming a second signal transmission layer on the base substrate, the second signal transmission layer comprising a data line, a source electrode and a drain electrode;

forming a passivation layer over the base substrate, the passivation layer having a second sub-through hole at a position corresponding to the common electrode line and a third through hole at a position corresponding to the drain electrode, a pixel electrode being connected with the drain electrode at the third through hole;

the first insulating layer comprises the gate insulating layer and the passivation layer, the second electrode sublayer further comprises an auxiliary electrode connected with the pixel electrode at least at a position corresponding to the third through hole.

Optionally, after forming the second signal transmission layer on the gate insulating layer and before forming the passivation layer over the second signal transmission layer, the method further comprises:

performing a plasma surface treatment to a region between the source electrode and the drain electrode.

In a further aspect, an embodiment of the present disclosure provides a display panel, comprising the array substrate of any of embodiments of the present disclosure.

BRIEF DESCRIPTION OF THE DRAWINGS

In order to explain technical solutions in embodiments of the present disclosure or in prior arts more clearly, the drawings that are used to illustrate the embodiments or prior art will be described briefly below. Apparently, the drawings described below only show some of the embodiments of the present disclosure. One skilled in the art can obtain other drawings according to these drawings without paying any inventive efforts.

DETAILED DESCRIPTION OF PREFERRED EMBODIMENTS

Figure 1:
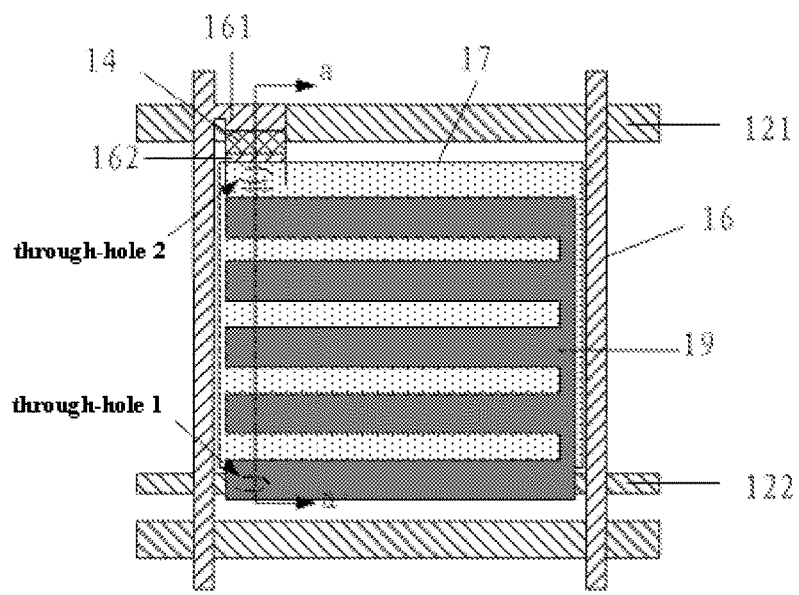
FIG. 1 is a schematic diagram of an existing array substrate.

Technique solutions in exemplary embodiments of the present disclosure will be described hereinafter in detail with reference to the attached drawings in the embodiments. Obviously, the described embodiments are only some of embodiments of the present disclosure, instead of all of the embodiments of the present disclosure. For those skilled in the art, other embodiments achieved by referring to the following embodiments without involving any inventive steps also fall into the scope of the present disclosure.

It is noted that orientation terms used herein, such as "upper", "lower" or the like, are used to define an position orientation with relative to the array substrate shown in the drawings, and it should be understood that these orientation terms are relative terms used for relative description and clarification and may be correspondingly changed as the orientation at which the array substrate shown in the drawings is placed varies.

In all embodiments of the present disclosure, definitions of phrases "film", "layer" and "pattern" and relationships thereamong will be expounded. Particularly, a "film" is a layer of film manufactured from a certain material on a base substrate by using a deposition process or other process. If no patterning process is performed to the "film" during the whole manufacturing, the "film" may be also called as a "layer"; if a patterning process needs be performed to the "film" during the whole manufacturing, the "film" may be called as a "film" before the patterning process and as a "layer" after the patterning process. The "layer" which has been subject to the patterning process includes at least one film "pattern".

Exemplarily, a gate insulating layer may be manufactured by depositing SiNx (silicon nitride) on a transparent base substrate. The gate insulating layer is generally not subject to any patterning process. Further exemplarily, an active layer is formed by performing a patterning process to an oxide semiconductor film. A gate electrode metal layer comprises a gate electrode and a gate line, so the gate electrode and the gate line are together called as a pattern.

The called "patterning process" is a process for forming a film into a layer including at least one pattern; the patterning process generally includes: coating photoresist over a film, exposing the photoresist to light by using a mask, then eroding and washing off a portion of the photoresist to be removed by using a developer, etching off a portion of the film which is not covered with the photoresist, and finally peeling off remained photoresist. In all embodiment of the present disclosure, phrase "one patterning process" is directed to processes of forming a desired layer structure through one exposure process.

Figure 2:
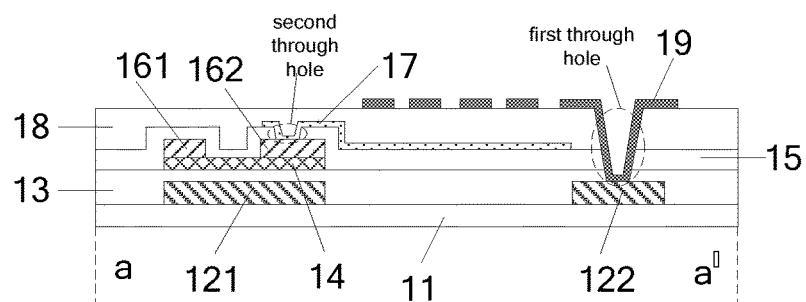
FIG. 2 is a schematic diagram taken along line a-a' shown in FIG. 1.

Exemplarily, as shown in FIG. 1, there is shown a schematic diagram of a display unit on an array substrate of an existing TFT-LCD display screen, and a plurality of gate lines 121 and data lines 16 are formed on the array substrate, the gate lines 121 and the data lines 16 cross each other to define a display unit. FIG. 2 is a schematic diagram taken along line a-a' shown in FIG. 1. As shown in FIG. 2, the array substrate comprises: a base substrate 11; a gate electrode (a portion of the gate line 121) and a common electrode line 122 formed on base substrate 11; a gate insulating layer 13 covering the gate electrode 121 and the common electrode line 122; an active layer 14, a source electrode 161 and a drain electrode 162 formed on gate insulating layer 13; a passivation layer 15 and a pixel electrode 17 formed on the passivation layer 15; a planarization layer 18 and a common electrode 19 formed on the planarization layer 18. Generally, the common electrode 19 is connected with the common electrode line 122 through a through hole 1 through the planarization layer 18, the passivation layer 15 and the gate insulating layer 13, and the pixel electrode 17 is connected with drain electrode 162 through a through hole 2 in the passivation layer 15.

It has been found by inventors that for the existing array substrate, as shown in FIG. 2, since the through hole 1 penetrates through the planarization layer 18, the passivation layer 15 and the gate insulating layer 13, the through hole 1 has a larger depth, so that a connection between the common electrode 19 and the common electrode line 122 will easily be broken, resulting in a poor display effect and reduction in yield of product.

Figure 3:
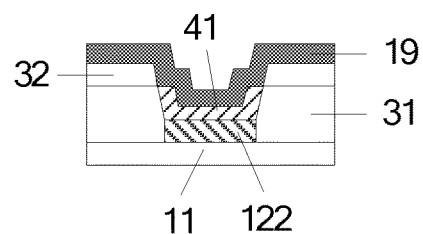
FIG. 3 is a schematic diagram of an array substrate provided according to an embodiment of the present disclosure.

An embodiment of the present disclosure provides an array substrate, as shown in FIG. 3, comprising:

a base substrate 11;

a first signal transmission layer comprising a common electrode line 122;

a first insulating layer 31 covering the first signal transmission layer and having a first through hole at a position corresponding to the common electrode line 122; the first through hole being formed by removing a portion of the first insulating layer 31 at a position corresponding to the common electrode line 122, and by forming the first through hole, an upper surface of a portion of the common electrode line 122 located below the first insulating layer 31 being exposed;

a first electrode layer located on the first insulating layer 31, the first electrode layer comprising a connection electrode 41 located at the position of the first through hole; in other words, the connection electrode 41 being in direct contact with the upper surface of the common electrode line 122 exposed from the first through hole;

a second insulating layer 32 covering the first electrode layer and having a second through hole at a position corresponding to the connection electrode 41; and the second through hole being formed by removing a portion of the second insulating layer 32 at a position corresponding to the common electrode line 122, and by forming the second through hole, an upper surface of a portion of the connection electrode 41 located below the second insulating layer 32 being exposed a second electrode layer comprising a common electrode 19 that covers the second through hole; in other words, the common electrode 19 is in direct contact with an upper surface of the connection electrode 41 that is exposed from the second through hole and thus the connection electrode 41 contacts the common electrode line 122 and the common electrode 19 respectively, in other words, the common electrode 19 is connected with the common electrode line 122 through the connection electrode 41.

It is noted that the array substrate may be further provided with other film or layer structures, and the array substrate has been described above by taking a region of the array substrate corresponding to a connection between the common electrode and the common electrode line as an example. Other film or layer structures may be not provided at a position corresponding to the common electrode, or the above described layer structure may include other film or layer structures. For example, in one embodiment, the array substrate comprises a thin film transistor, and if an active layer of the thin film transistor is only located at a position corresponding to a gate electrode, the pattern of the active layer is not included at a position corresponding to the common electrode line; and the thin film transistor may further comprise a source-drain metal layer, which may include the above connection electrode.

Embodiments of the present disclosure provide an array substrate, where the common electrode is connected with the common electrode line through the first through hole in the first insulating layer and the second through hole in second insulating layer, and the connection electrode is further formed at the first through hole so that the common electrode is connected with a common electrode line through the connection electrode. Compared with the configuration in which the common electrode is directly connected with the common electrode line, with the array substrate and the method of manufacturing the same, and the display panel provided according to the embodiments of the present disclosure, a depth for a connection between the common electrode and the common electrode line may be reduced, thereby preventing easy breakage between the connection between the common electrode and the common electrode line due to larger depths of the first through hole and the second through hole.

Optionally, the second through hole is located at a position corresponding to the first through hole. For example, as shown in FIG. 3, the common electrode 19 is connected with the common electrode line 122 at a depth which is a sum of depths of the first through hole and the second through hole. Compared to an existing common electrode being directly connected with a common electrode line at the first through hole and a second through hole, the array substrate according to embodiments of the present disclosure, as shown in FIG. 3, is configured such that the connection electrode 41 is located at the first through hole so that the depth at which the common electrode 19 is connected with the common electrode line 122 is reduced, thereby preventing easy breakage between the common electrode and the common electrode line due to larger depths of the first through hole and the second through hole.

Figure 4:
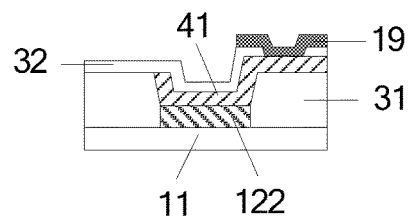
FIG. 4 is a schematic diagram of another array substrate provided according to an embodiment of the present disclosure.

In one embodiment of the present disclosure, as shown in FIG. 4, the connection electrode 41 extends out of the first through hole and extends over at least a portion of an upper surface of the first insulating layer 31; and the second through hole is formed at a position of the second insulating layer 32 corresponding to a portion, which extends out of the first through hole and extends over at least a portion of an upper surface of the first insulating layer 31, of the connection electrode 41. In other words, the first through hole may be located at a position offset from the second through hole, and the common electrode 19 is connected with the common electrode line 122 through the connection electrode 41, thereby preventing easy breakage between the common electrode and the common electrode line due to larger depths of the first through hole and the second through hole.

Figure 5:
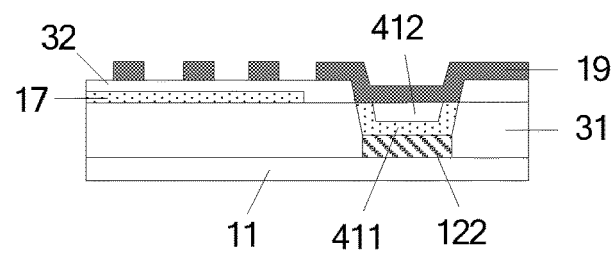
FIG. 5 is a schematic diagram of a further array substrate provided according to an embodiment of the present disclosure.

In one embodiment of the present disclosure, as shown in FIG. 5, the first electrode layer comprises:

a first electrode sub-layer comprising a pixel electrode 17 and a first connection electrode 411 located at the position of the first through hole; and a second electrode sub-layer comprising a second connection electrode 412 located at the position of the first through hole, the second electrode sub-layer being disposed on the first electrode sub-layer 411.

It is noted that the first electrode layer may include a plurality of conductive layers, which are not limited to the first electrode sub-layer and the second electrode sub-layer described above. In an embodiment of the present disclosure, the first electrode layer may further comprise a third electrode sub-layer and the like. Since the array substrate is formed with a pixel electrode, the first electrode sub-layer includes the pixel electrode and the first connection electrode, in other words, the pixel electrode and the first connection electrode are formed through one patterning process, thereby an additional exposure process for separately forming the first electrode sub-layer may be avoided.

In one embodiment of the present disclosure, a material for forming the first electrode sub-layer comprises a tin indium oxide material and a material for forming the second electrode sub-layer comprises metal. The pixel electrode is generally a transparent electrode, so the material for forming the first electrode sub-layer may be tin indium oxide. Metal has a better conductivity compared to a metal oxide. In order to improve the conductivity of the connection electrode, it is preferable that the material of the second electrode sub-layer is metal. An exemplary material of the second electrode sub-layer may be molybdenum metal, aluminum metal or the like.

In one embodiment of the present disclosure, the second sub-layer may comprise two molybdenum metal layers and an aluminum metal layer between the two molybdenum metal layers. In prior arts, the material of the second electrode sub-layer is aluminum, which has a more active metallicity. Thus, when forming other film or layer structures after the second electrode sub-layer, for example, when forming the second electrode layer, the aluminum metal will easily regrow under a high temperature environment, that is, there will be formed a smaller protrusion, which will contact the second electrode layer, thereby resulting in a short circuit. Thus, in one embodiment of the present disclosure, molybdenum metal layers are formed on either side of the aluminum metal layer respectively. Since the molybdenum metal layer is more stable than the aluminum metal layer, the second electrode sub-layer may be prevented from contacting other electrode layer at high temperature.

Figure 6:
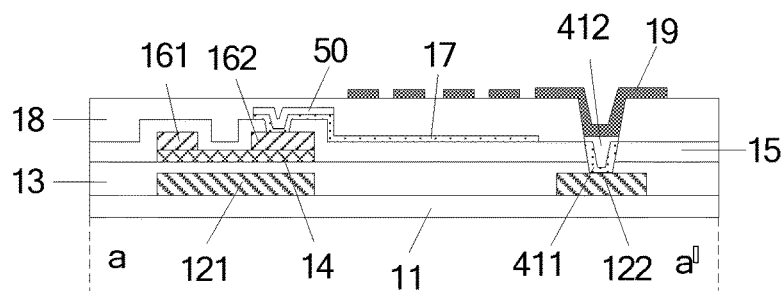
FIG. 6 is a schematic diagram of a still further array substrate provided according to an embodiment of the present disclosure.

In one embodiment, as shown in FIG. 6, the first signal transmission layer further comprises a gate line and a gate electrode 121; the array substrate further comprises:

a gate insulating layer 13 covering the first signal transmission layer and having a first sub-through hole at a position corresponding to the common electrode line 122;

an active layer 14 located on the gate insulating layer 13;

a second signal transmission layer comprising a data line, a source electrode 161 and a drain electrode 162; and a passivation layer 15 having a second sub-through hole at a position corresponding to the first sub-through hole and a third through hole at a position corresponding to the drain electrode, the pixel electrode 17 being connected with the drain electrode 162 at the third sub-through hole;

the first electrode layer is disposed on the passivation layer 15, the first insulating layer comprises the gate insulating layer 14 and the passivation layer 15, the second electrode sub-layer further comprises an auxiliary electrode 50 connected with the pixel electrode 17 at least at a position corresponding to the third through hole.

That is, the first insulating layer includes the gate insulating layer 13 and the passivation layer 15, and the first through hole includes the first sub-through hole in the gate insulating layer 13 and the second sub-through hole in the passivation layer 15.

The array substrate further comprises a thin film transistor, which comprises the gate electrode, the source electrode and the drain electrode; wherein, the passivation layer has the third through hole at a position corresponding to the drain electrode and the pixel electrode is connected with drain electrode at the third through hole, and, as the second electrode sub-layer is located above the first electrode sub-layer, the auxiliary electrode, which is connected with the pixel electrode, is formed at a position of the second electrode sub-layer corresponding to the third through hole. In one embodiment, the second electrode sub-layer includes two molybdenum metal layers having a better stability, with an aluminum metal layer located between the two molybdenum metal layers; and the second electrode sub-layer is located above the pixel electrode at a position where the pixel electrode is connected with the drain electrode, such that the pixel electrode may be further prevented from contacting air at the position, thereby further protecting a normal connection between the pixel electrode and the drain electrode.

In one embodiment, the array substrate comprises a transparent region and a non-transparent region, and the auxiliary electrode is connected with the pixel electrode within the non-transparent region. Since the pixel electrode is formed within the transparent region mainly for light transmission display, the auxiliary electrode is provided within the non-transparent region and connected with the pixel electrode, thereby further protecting a normal connection between the pixel electrode and the drain electrode.

Figure 7:
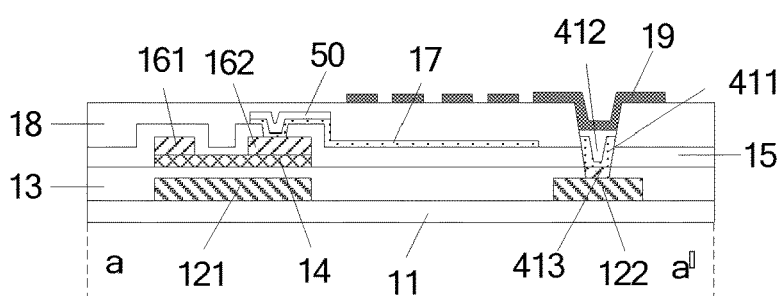
FIG. 7 is a schematic diagram of a yet still further array substrate provided according to an embodiment of the present disclosure.

In one embodiment, as shown in FIG. 7, the second signal transmission layer further comprises a third connection electrode 413 located at the position of the first through hole; that is, the second signal transmission layer further comprises the third connection electrode 413 between the common electrode 19 and the common electrode line 122, thereby further reducing the depth at which the common electrode 19 is connected with the common electrode line 122. Further, the third connection electrode, the source electrode and the drain electrode are formed simultaneously, reducing the number of patterning processes by one.

Figure 8:
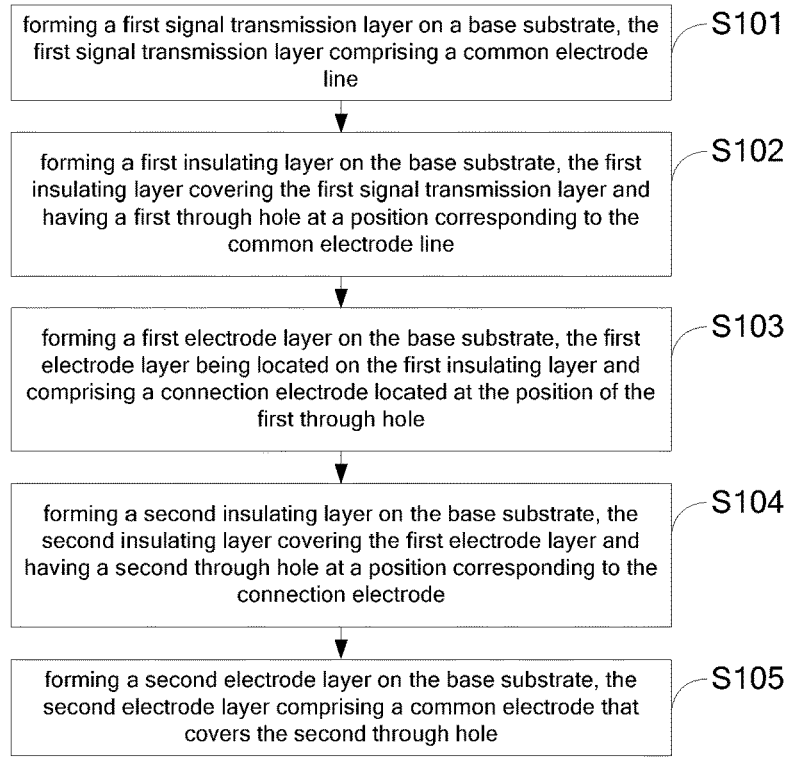
FIG. 8 is a schematic diagram showing a method of manufacturing an array substrate provided according to an embodiment of the present disclosure.

An embodiment of the present disclosure provides a method of manufacturing an array substrate. As shown in FIG. 8, the method comprises a step 101: forming a first signal transmission layer on a base substrate, the first signal transmission layer comprising a common electrode line.

Exemplarily, the step 101 comprises: forming a metal film on the base substrate, exposing the metal film, and etching the metal film to form the first signal transmission layer including the common electrode line. Particularly, the exposure and etching may be performed in a mask patterning process.

The method further comprises a step 102: forming a first insulating layer on the base substrate, the first insulating layer covering the first signal transmission layer and having a first through hole at a position corresponding to the common electrode line.

Exemplarily, the step 102 includes: forming the first insulating film on the base substrate to cover the first signal transmission layer, performing exposure and etching processes to the first insulating film so as to form a through hole in the first insulating film at a position corresponding to the common electrode line, such that an upper surface of the common electrode line is exposed from the through hole of the first insulating film.

The method further comprises a step 103: forming a first electrode layer on the base substrate, the first electrode layer being located on the first insulating layer and comprising a connection electrode located at the position of the first through hole.

In an embodiment, the step 103 includes: forming a first conductive film, a second conductive film and photoresist on the base substrate to cover the first electrode layer, the first conductive film and the second conductive film covering the first through hole.

In an embodiment of the present disclosure, the exposure and development processes are performed to a photoresist by using a half gray-scale mask, in which the half gray-scale mask includes a transparent region, a semitransparent region corresponding to a pixel electrode and a non-transparent region corresponding to the first through hole; a portion of the developed photoresist corresponding to the transparent region is fully removed so as to expose the second conductive film, and a portion of the developed photoresist corresponding to the semitransparent region is partially removed; portions of the second conductive film and the first conductive film corresponding to the transparent region are etched off; an ashing treatment is performed to the photoresist such that a portion of the photoresist corresponding to semitransparent region is fully removed to expose the second conductive film and a portion of the photoresist corresponding to the non-transparent region is remained; a portion of the second conductive film corresponding to the semitransparent region is etched off; and the photoresist is peeled off.

In one embodiment of the present disclosure, the conductive film is made of metal, i.e., the second electrode sub-layer is formed from a metal. Compared to metal oxide, the metal has a better conductivity. In one embodiment, in order to improve the conductivity of the connection electrode, the material of the second electrode sub-layer is metal. For example, the material of the second electrode sub-layer may be molybdenum metal, aluminum metal or the like.

It is noted that the second electrode sub-layer is generally made of metal, and thus, the second electrode sub-layer is generally dry-etched, while the first electrode sub-layer is wet-etched. If the material of the second electrode sub-layer is molybdenum metal, both the second electrode sub-layer and the first electrode sub-layer may be wet-etched, thereby simplifying process steps.

In one embodiment, the step of forming a first conductive film, a second conductive film and photoresist on the base substrate to cover the first electrode layer further comprises:

forming the first conductive film on the first insulating layer;

forming the second conductive film on the first conductive film, including forming a molybdenum metal film, an aluminum metal film and a molybdenum metal film sequentially; and forming the photoresist over the second conductive film.

That is, the second electrode sub-layer may comprise two molybdenum metal layers and an aluminum metal layer between the two molybdenum metal layers. In as an exemplary embodiment where the material of the second electrode sub-layer is aluminum, as the aluminum has a more active metallicity, when forming other film or layer structures after the second electrode sub-layer, for example, when forming the second electrode layer, the aluminum metal will easily regrow under a high temperature environment, that is, there will be formed smaller protrusions, which will contact the second electrode layer, thereby resulting in a short circuit. Thus, in an embodiment of the present disclosure, molybdenum metal layers are formed on either side of the aluminum metal layer respectively. Since the molybdenum metal layer is more stable than the aluminum metal layer, the second electrode sub-layer may be prevented from contacting other electrode layers.

It is noted that when the second electrode includes three material layers of molybdenum, aluminum and molybdenum, the second electrode sub-layer is dry-etched, while the first electrode is wet-etched.

In one embodiment, the first conductive film is formed from a tin indium oxide material. The pixel electrode is generally a transparent electrode, and thus the first electrode sub-layer is formed from a tin indium oxide material.

The method further comprises a step 104: forming a second insulating layer on the base substrate, the second insulating layer covering the first electrode layer and having a second through hole at a position corresponding to the connection electrode.

Exemplarily, the step 104 includes: forming the second insulating film on the first electrode layer to cover first electrode layer, and performing exposure and etching processes to the second insulating film so as to remove a portion of the second insulating film corresponding to the through hole of the first insulating layer, such that an upper surface of the connection electrode is exposed.

In one embodiment, the step of the second insulating layer having a second through hole at a position corresponding to the connection electrode particularly comprises:

the connection electrode layer has the second through hole at a position corresponding to the first through hole. That is, the second through hole is located at a position corresponding to the first through hole, as shown in FIG. 3, The common electrode 19 is connected with the common electrode line 122 at a depth which is a sum of depths the first through hole and the second through hole.

Or, the connection electrode extends out of the first through hole and extends over at least a portion of an upper surface of the first insulating layer, and the second insulating layer having a second through hole at a position corresponding to the connection electrode particularly comprises: the second insulating layer having the second through hole at a position corresponding to a portion of the connection electrode extending out of the first through hole.

Particularly, by referring to FIG. 4, the connection electrode 19 extends out of the first through hole and extends over at least a portion of an upper surface of the first insulating layer 31; and the second insulating layer 31 has a second through hole at a position corresponding to a portion of the connection electrode 41 extending out of the first through hole. That is, the first through hole may be also located at a position offset from the second through hole, and the common electrode is connected with the common electrode line through the connection electrode, thereby preventing easy breakage between the common electrode and the common electrode line due to larger depths of the first through hole and the second through hole.

The method may further comprise a step 105: forming a second electrode layer on the base substrate, the second electrode layer comprising a common electrode that covers the second through hole. In an example, the connection electrode contacts the common electrode line and the common electrode respectively.

Figure 9:
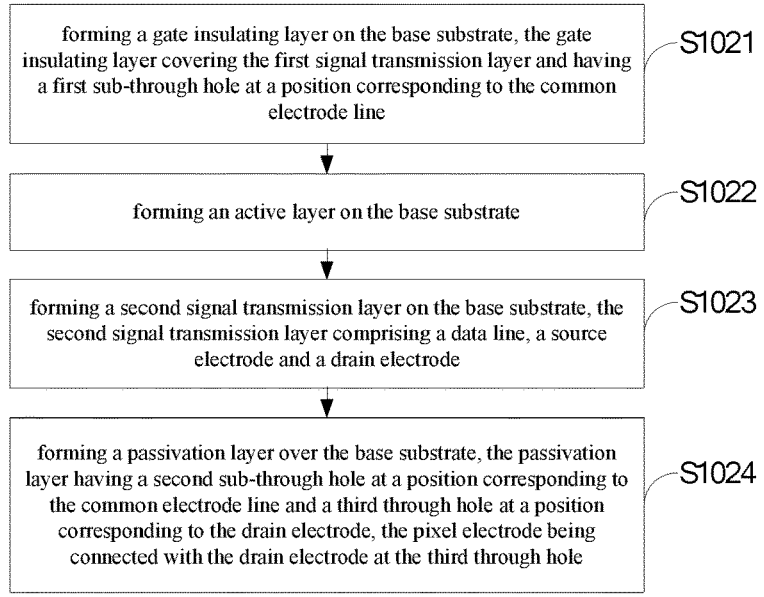
FIG. 9 is a schematic diagram showing a method of manufacturing a first insulating layer provided according to an embodiment of the present disclosure.

Optionally, the first signal transmission layer further comprises a gate line and a gate electrode. As shown in FIG. 9, the step of forming a first insulating layer on the base substrate to cover the first signal transmission layer further comprises:

a step 1021: forming a gate insulating layer on the base substrate, the gate insulating layer covering the first signal transmission layer and having a first sub-through hole at a position corresponding to the common electrode line.

Exemplarily, the step 201 includes: forming an insulating film on the base substrate, and performing exposure and etching processes to the insulating film so as to form a gate insulating layer, which has a first sub-through hole at a position corresponding to the common electrode line.

The step of forming a first insulating layer on the base substrate to cover the first signal transmission layer may further comprise a step 1022: forming an active layer on the base substrate. Particularly it comprises: forming a semiconductor film on the base substrate, and performing exposure and etching processes to the semiconductor film to form an active layer.

The step of forming a first insulating layer on the base substrate to cover the first signal transmission layer may further comprise a step 1023: forming a second signal transmission layer on the base substrate, the second signal transmission layer comprising a data line, a source electrode and a drain electrode.

Particularly, the step 1023 includes: forming a metal film and photoresist on the active layer; performing exposure and development processes to the photoresist by using a mask, which includes a transparent region and a non-transparent region corresponding to the data line, the source electrode and the drain electrode, fully removing a portion of the developed photoresist corresponding to the transparent region so as to expose the metal film, and etching a portion of the metal film corresponding to the transparent region; and peeling off the photoresist.

The step of forming a first insulating layer on the base substrate to cover the first signal transmission layer may further comprise a step 1024: forming a passivation layer over the base substrate, the passivation layer having a second sub-through hole at a position corresponding to the common electrode line and a third through hole at a position corresponding to the drain electrode, and the pixel electrode being connected with the drain electrode at the third through hole.

Particularly, the step 1024 includes: forming an insulating film on the second signal transmission layer, performing exposure and etching processes to the insulating film so as to form through holes at positions corresponding to the drain electrode and the common electrode line, such that an upper surface of the drain electrode and an upper surface of the common electrode line are exposed.

The first insulating layer comprises the gate insulating layer and the passivation layer, and the second electrode sub-layer further comprises an auxiliary electrode connected with the pixel electrode at least at a position corresponding to the third through hole.

The formed array substrate is shown in FIG. 6, the array substrate further comprises a thin film transistor, which comprises the gate electrode, the source electrode and the drain electrode. In an example, the passivation layer has the third through hole at a position corresponding to the drain electrode and is connected with drain electrode at the third through hole, and, as the second electrode sub-layer is located above the first electrode sub-layer, the auxiliary electrode, which is connected with the pixel electrode, is formed at a position of the second electrode sub-layer corresponding to the third through hole. In an example where the second electrode sub-layer includes two molybdenum metal layers and an aluminum metal layer located between the two molybdenum metal layers, the molybdenum metal layer has a better stability, and the second electrode sub-layer is located above the pixel electrode at a position where the pixel electrode is connected with the drain electrode, such that the pixel electrode may be further prevented from contact air at the position, thereby further protecting a normal connection between the pixel electrode and the drain electrode.

In the array substrate shown in FIG. 6, the first insulating layer includes the gate insulating layer 13 and the passivation layer 15, and the first through hole includes the first sub-through hole in the gate insulating layer 13 and the second sub-through hole in the passivation layer 15.

In one embodiment, the second signal transmission layer further comprises a third connection electrode located at the position of the first through hole. As shown in FIG. 7, the second signal transmission layer further comprises the third connection electrode 413 between the common electrode 19 and the common electrode line 122, thereby the depth at which the common electrode 19 is connected with the common electrode line 122 may be further reduced. Further, the third connection electrode, the source electrode and the drain electrode are formed simultaneously, reducing the number of patterning processes by one.

Figure 10:
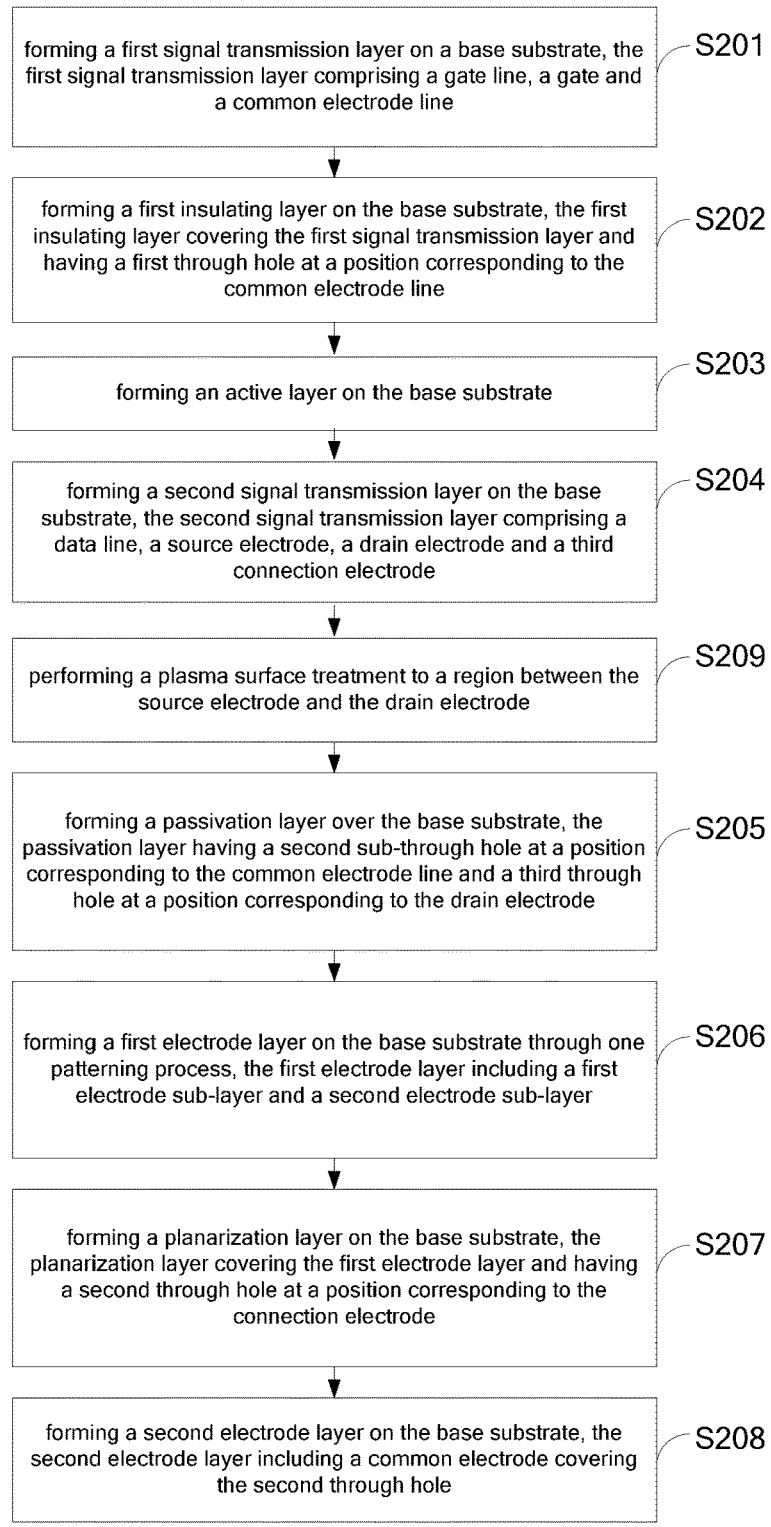
FIG. 10 is a schematic diagram showing another method of manufacturing a first insulating layer provided according to an embodiment of the present disclosure.

In one embodiment, as shown in FIG. 10, after the step 1023 and before the step 1024, the method further comprises:

a step 1025: performing a plasma surface treatment to a region between the source electrode and the drain electrode.

In an example, the plasma surface treatment may be performed by using gases such as $SF_6+O_2$, $H_2$ or the like, for purpose of clearing impurity ions in a conductive channel and reducing defects in a layer of the conductive channel. Of course, the plasma surface treatment may be performed to the region between the source electrode and the drain electrode by using other gases, and embodiments of the present disclosure are only described by taking the above as an example.

In the method of manufacturing an array substrate provided according to the embodiments of the present disclosure, the channel region is subject to the plasma treatment before forming the passivation layer such that impact damages of the channel generated during etching the channel may be corrected and alleviated, and a gas treatment may be performed to the channel to clear impurity ions in the conductive channel such that defects in the layer of the conductive channel may be reduced, thereby performances of the thin film transistor may be improved.

Figure 11:
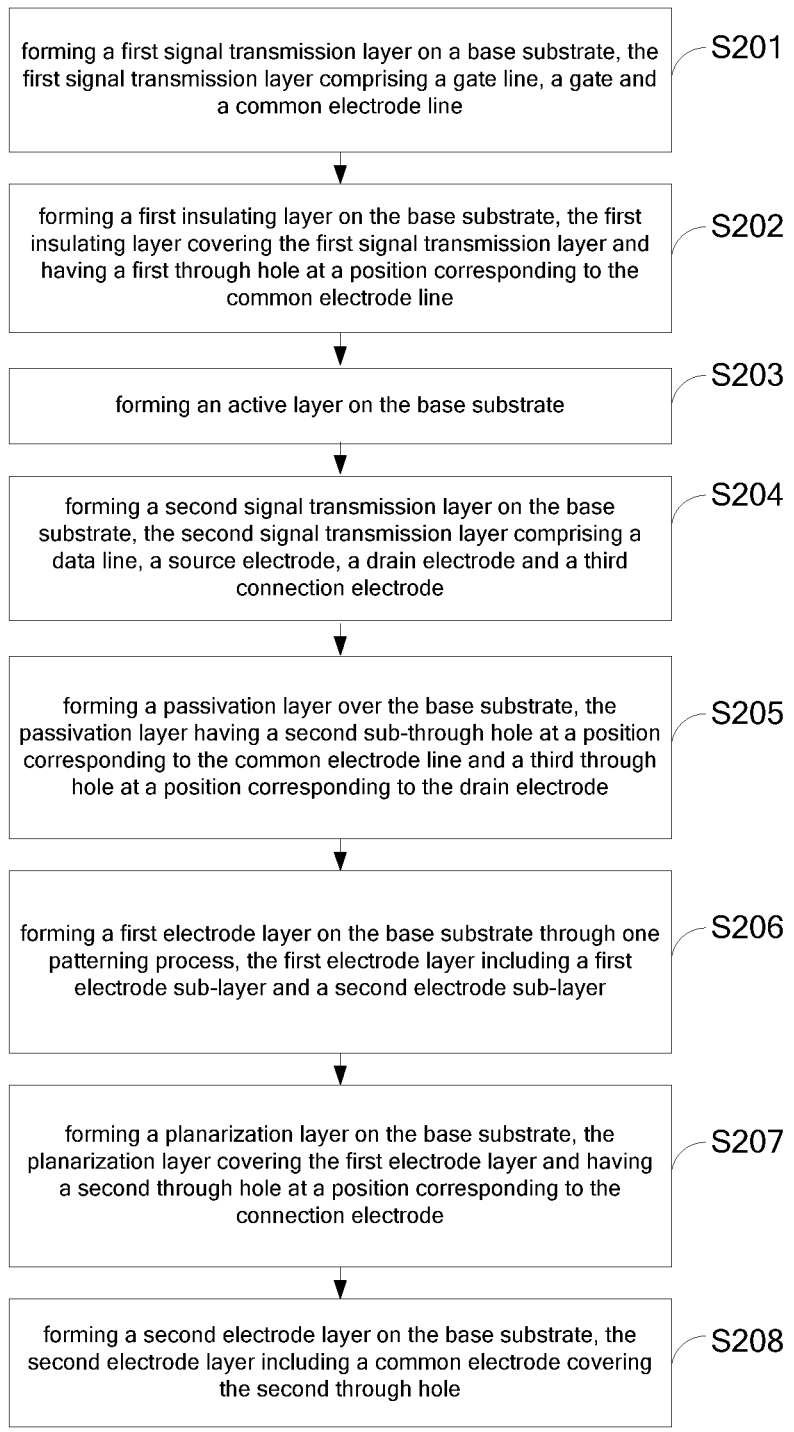
FIG. 11 is a schematic diagram showing another method of manufacturing an array substrate provided according to an embodiment of the present disclosure.

Hereinafter, an exemplary embodiment is provided to describe the method of manufacturing an array substrate shown in FIG. 7; as shown in FIG. 11, the method includes:

step 201: forming a first signal transmission layer on a base substrate, the first signal transmission layer comprising a gate line, a gate electrode and a common electrode line;

step 202: forming a first insulating layer on the base substrate, the first insulating layer covering the first signal transmission layer and having a first through hole at a position corresponding to the common electrode line;

step 203: forming an active layer on the base substrate;

step 204: forming a second signal transmission layer on the base substrate, the second signal transmission layer comprising a data line, a source electrode, a drain electrode and a third connection electrode;

step 205: performing a plasma surface treatment to a region between the source electrode and the drain electrode;

step 206: forming a passivation layer over the base substrate, the passivation layer having a second sub-through hole at a position corresponding to the common electrode line and a third through hole at a position corresponding to the drain electrode;

step 207: forming a first electrode layer on the base substrate through a single patterning process, the first electrode layer including a first electrode sub-layer and a second electrode sub-layer, the first electrode sub-layer including a pixel electrode and a first connection electrode, the second electrode sub-layer including a second connection electrode; and details may be obtained by referring to the above step 103;

step 208: forming a planarization layer on the base substrate, the planarization layer covering the first electrode layer and having a second through hole at a position corresponding to the connection electrode; and step 209: forming a second electrode layer on the base substrate, the second electrode layer including a common electrode covering the second through hole, and the connection electrode contacting the common electrode line and the common electrode respectively.

Of course, the method of manufacturing an array substrate shown in FIG. 7 is not limited to the above steps. For example, the first electrode sub-layer and the second electrode sub-layer may be formed through two patterning processes. The embodiments of the present disclosure are only described by taking the above as an example.

The embodiments of the present disclosure provide an array substrate and a method of manufacturing the same, and a display panel, where the common electrode on the array substrate is connected with the common electrode line through the first through hole in the first insulating layer and the second through hole in second insulating layer, and the connection electrode is further formed at the first through hole so that the common electrode is connected with the connection electrode. With the array substrate and the method of manufacturing the same, and the display panel provided according to the embodiments of the present disclosure, compared to a direct connection between a common electrode and a common electrode line, a depth for a connection between the common electrode and the common electrode line may be reduced, thereby preventing easy breakage between the connection between the common electrode and the common electrode line due to larger depths of the first through hole and the second through hole.

The above described contents are only exemplary embodiments of the present disclosure, and the scope of the present invention is not limited to those. Various changes or modifications, which may be easily envisaged by those skilled in the art in these embodiments without departing from the principles and spirit of the present disclosure, are intended to be covered within the scope of the present invention. Therefore, the scope of the present invention is defined in the claims and their equivalents.

What is claimed is:

1. An array substrate, comprising:
   a base substrate;
   a first signal transmission layer comprising a common electrode line;
   a first insulating layer covering the first signal transmission layer and having a first through hole at a position corresponding to the common electrode line;
   a first electrode layer located on the first insulating layer, the first electrode layer comprising a connection electrode located at the position of the first through hole;
   a second insulating layer covering the first electrode layer and having a second through hole at a position corresponding to the connection electrode; and
   a second electrode layer comprising a common electrode that covers the second through hole;
   wherein the connection electrode is in contact with the common electrode line and the common electrode respectively; and
   wherein the first electrode layer comprises:
      a first electrode sub-layer, comprising a pixel electrode and a first connection electrode located at the position of the first through hole; and
      a second electrode sub-layer comprising a second connection electrode located at the position of the first through hole, the second sub-layer being disposed on the first electrode sub-layer.

2. The array substrate according to claim 1, wherein
   the second through hole is located at a position corresponding to the first through hole; or
   the connection electrode extends out of the first through hole and extends over at least a portion of an upper surface of the first insulating layer; and the second through hole is formed at a position of the second insulating layer corresponding to a portion, which extends out of the first through hole and extends over at least a portion of an upper surface of the first insulating layer, of the connection electrode.

3. The array substrate according to claim 1, wherein a material for forming the first electrode sub-layer comprises a tin indium oxide material and a material for forming the second electrode sub-layer comprises a metal.

4. The array substrate according to claim 3, wherein the second sub-layer comprises two molybdenum metal layers and an aluminum metal layer located between the two molybdenum metal layers.

5. The array substrate according to claim 1, wherein the first signal transmission layer further comprises a gate line and a gate electrode;
   the array substrate further comprises:
      a gate insulating layer covering the first signal transmission layer and having a first sub-through hole at a position corresponding to the common electrode line;
      an active layer located on the gate insulating layer;
      a second signal transmission layer comprising a data line, a source electrode and a drain electrode; and
      a passivation layer having a second sub-through hole at a position corresponding to the first sub-through hole and a third through hole at a position corresponding to the drain electrode, a pixel electrode being connected with the drain electrode at the third sub-through hole;
   wherein, the first electrode layer is disposed on the passivation layer, the first insulating layer comprises the gate insulating layer and the passivation layer, the second electrode sub-layer further comprises an auxiliary electrode connected with the pixel electrode at least at a position corresponding to the third through hole.

6. The array substrate according to claim 5, wherein the array substrate comprises a transparent region and a non-transparent region, and the auxiliary electrode is connected with the pixel electrode within the non-transparent region.

7. The array substrate according to claim 5, wherein the second signal transmission layer further comprises a third connection electrode located at the position of the first through hole.

8. A display panel, comprising the array substrate according to claim 1.

9. A method of manufacturing an array substrate, comprising steps of:
   forming a first signal transmission layer on a base substrate, the first signal transmission layer comprising a common electrode line;
   forming a first insulating layer on the base substrate, the first insulating layer covering the first signal transmission layer and the first insulating layer having a first through hole at a position corresponding to the common electrode line;
   forming a first electrode layer on the base substrate, the first electrode layer being located on the first insulating layer and comprising a connection electrode located at the position of the first through hole;
   forming a second insulating layer on the base substrate, the second insulating layer covering the first electrode layer and the second insulating layer having a second through hole at a position corresponding to the connection electrode; and
   forming a second electrode layer on the base substrate, the second electrode layer comprising a common electrode that covers the second through hole;
   wherein the connection electrode is in contact with the common electrode line and the common electrode respectively; and
   wherein the step of forming the first electrode layer on the base substrate further comprises:
      forming a first conductive film, a second conductive film and photoresist on the base substrate to cover the first electrode layer, the first conductive film and the second conductive film covering the first through hole;
      performing exposure and development processes to the photoresist by using a half gray-scale mask, which includes a transparent region, a semitransparent region corresponding to a pixel electrode and a non-transparent region corresponding to the first through hole;
      full removing a portion of the developed photoresist corresponding to the transparent region so as to expose the second conductive film, and partially removing a portion of the developed photoresist corresponding to the semitransparent region;
      etching portions of the second conductive film and the first conductive film corresponding to the transparent region;

performing an ashing treatment to the photoresist such that a portion of the photoresist corresponding to semitransparent region is fully removed to expose the second conductive film and a portion of the photoresist corresponding to the non-transparent region is remained;

etching a portion of the second conductive film corresponding to the semitransparent region; and peeling off the photoresist.

10. The method according to claim 9, wherein in the step of forming a second insulating layer on the base substrate, the connection electrode layer has the second through hole at a position corresponding to the first through hole; or the connection electrode extends out of the first through hole and extends over at least a portion of an upper surface of the first insulating layer, and the second through hole is formed at a position of the second insulating layer corresponding to a portion, which extends out of the first through hole and extends over at least a portion of an upper surface of the first insulating layer, of the connection electrode.

11. The method according to claim 9, wherein the first conductive film is formed from a tin indium oxide material and the second conductive film is formed from a metal material.

12. The method according to claim 9, wherein the step of forming the first conductive film, the second conductive film and photoresist on the base substrate to cover the first electrode layer further comprises:

forming the first conductive film on the first insulating layer;

forming the second conductive film on the first conductive film, including forming a molybdenum metal film, an aluminum metal film and a molybdenum metal film sequentially; and forming the photoresist over the second conductive film.

13. The method according to claim 9, wherein the first signal transmission layer further comprises a gate line and a gate electrode; and the step of forming the first insulating layer on the base substrate to cover the first signal transmission layer further comprises:

forming a gate insulating layer on the base substrate, the gate insulating layer covering the first signal transmission layer and the gate insulating layer having a first sub-through hole at a position corresponding to the common electrode line;

forming an active layer on the base substrate;

forming a second signal transmission layer on the base substrate, the second signal transmission layer comprising a data line, a source electrode and a drain electrode; and forming a passivation layer over the base substrate, the passivation layer having a second sub-through hole at a position corresponding to the common electrode line and a third through hole at a position corresponding to the drain electrode, a pixel electrode being connected with the drain electrode at the third through hole;

wherein the first insulating layer comprises the gate insulating layer and the passivation layer, and the second electrode sub-layer further comprises an auxiliary electrode connected with the pixel electrode at least at a position corresponding to the third through hole.

14. The method according to claim 11, wherein after forming the second signal transmission layer on the gate insulating layer and before forming the passivation layer over the second signal transmission layer, the method further comprises:

performing a plasma surface treatment to a region between the source electrode and the drain electrode.

15. The method according to claim 12, wherein after forming the second signal transmission layer on the gate insulating layer and before forming the passivation layer over the second signal transmission layer, the method further comprises:

performing a plasma surface treatment to a region between the source electrode and the drain electrode.

\* \* \* \* \*